United States Patent
Kuhn et al.

(10) Patent No.: US 6,770,136 B2
(45) Date of Patent: Aug. 3, 2004

(54) DEVICE HAVING A FOIL-LINED CRUCIBLE FOR THE SUBLIMATION GROWTH OF AN SIC SINGLE CRYSTAL

(75) Inventors: Harald Kuhn, Erlangen (DE); Rene Stein, Roettenbach (DE); Johannes Voelkl, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 267 days.

(21) Appl. No.: 10/042,058

(22) Filed: Jan. 7, 2002

(65) Prior Publication Data

US 2002/0096108 A1 Jul. 25, 2002

Related U.S. Application Data

(63) Continuation of application No. PCT/DE00/02170, filed on Jul. 4, 2000.

(30) Foreign Application Priority Data

Jul. 7, 1999 (DE) .......................................... 199 31 334

(51) Int. Cl.$^7$ .............................................. C30B 35/00
(52) U.S. Cl. ......................... 117/200; 117/84; 117/951
(58) Field of Search ........................... 117/84, 951, 200

(56) References Cited

U.S. PATENT DOCUMENTS

| | | | |
|---|---|---|---|
| 4,186,046 A | | 1/1980 | DeLai et al. |
| 4,883,639 A | * | 11/1989 | Adlerborn et al. ............. 419/49 |
| 5,400,947 A | * | 3/1995 | Wang et al. .............. 228/124.5 |
| 5,667,587 A | | 9/1997 | Glass et al. |
| 5,895,526 A | | 4/1999 | Kitoh et al. |
| 5,968,261 A | * | 10/1999 | Barrett et al. .................. 117/13 |
| 5,977,552 A | * | 11/1999 | Foad ...................... 250/492.21 |

FOREIGN PATENT DOCUMENTS

| | | |
|---|---|---|
| DE | 32 30 727 C2 | 2/1984 |
| DE | 36 44 746 A1 | 7/1988 |
| JP | 10 291 899 A | 11/1998 |
| JP | 11 116 398 | 4/1999 |
| JP | 11 116 399 | 4/1999 |
| WO | WO 94/23096 | 10/1994 |
| WO | WO 97/27350 | 7/1997 |

OTHER PUBLICATIONS

Hofmann, D. et al.: "Use of Ta Container Material for Quality Improvement of SiC crystals grown by the Sublimation Technique", IOP Publishing Ltd, 1996, pp. 29–32.
Mokhov, E. et al.: "Growth of Silicon Carbide Bulk Crystals by the Sublimation Sandwich Method", Elsevier Science S.A., 1997, pp. 317–323.
"Tantal, Tantal–Legierung" (tantalum, tantalum alloy), Römpp Chemie–Lexikon (chemistry encyclopedia), vol. 9; 1995, pp. 4453–4455.

* cited by examiner

*Primary Examiner*—Nadine G. Norton
*Assistant Examiner*—Matthew A. Anderson
(74) *Attorney, Agent, or Firm*—Laurence A. Greenberg; Werner H. Stemer; Ralph E. Locher

(57) ABSTRACT

A device for the sublimation growth of an SiC single crystal, with foil-lined crucible. The device for producing an SiC single crystal includes a crucible with a crucible inner zone. Inside this zone, there is a storage area for storing a stock of solid SiC and a crystal area in which an SiC single crystal grows onto an SiC seed crystal. A heater device is arranged outside the crucible. On a side that faces the crucible inner zone, the crucible is lined with a foil of tantalum, tungsten, niobium, molybdenum, rhenium, iridium, ruthenium, hafnium or zirconium. As a result, the crucible is sealed and a reaction between the aggressive components of the SiC gas phase and the crucible wall is prevented.

10 Claims, 1 Drawing Sheet

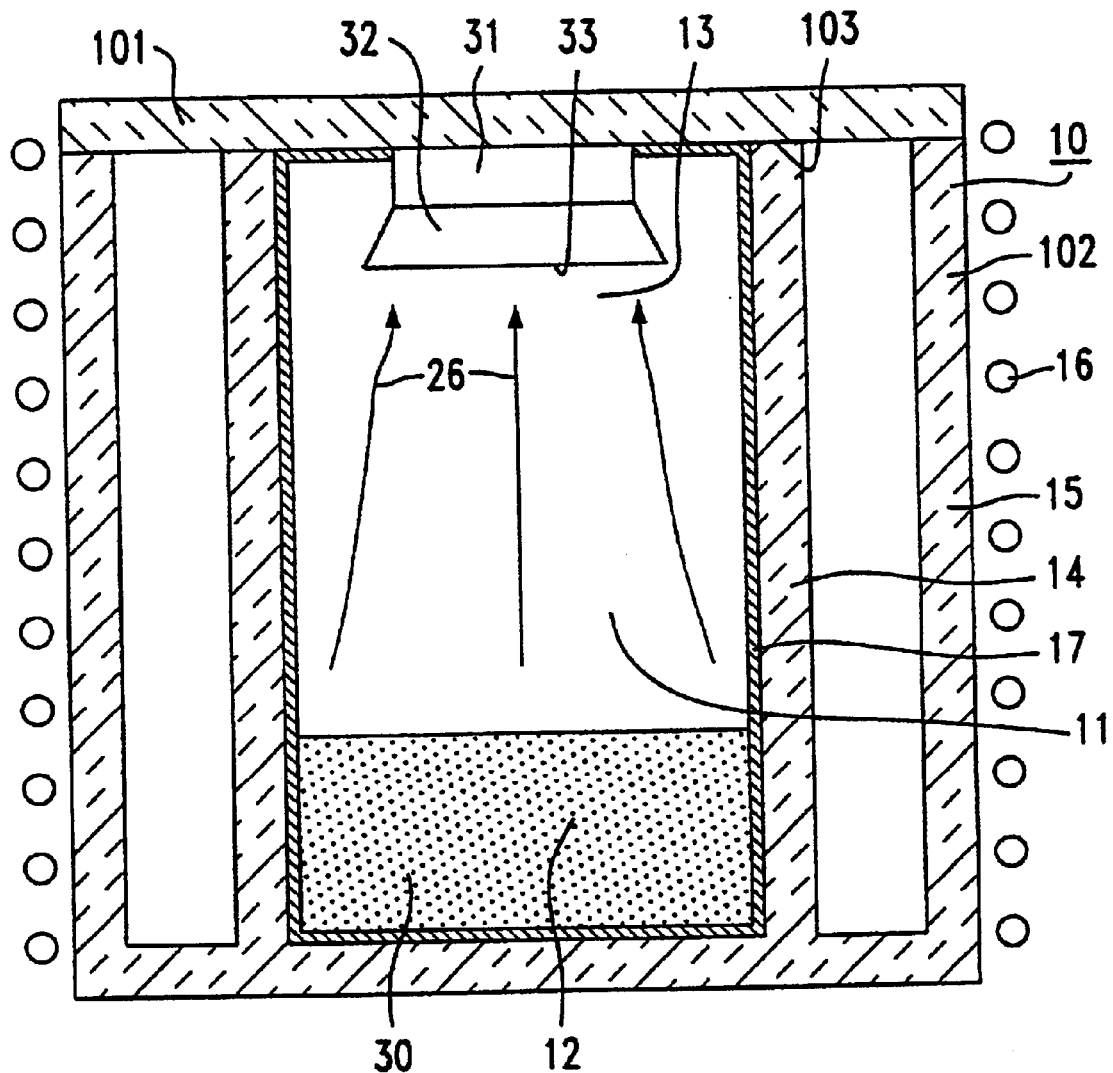

DEVICE HAVING A FOIL-LINED CRUCIBLE FOR THE SUBLIMATION GROWTH OF AN SIC SINGLE CRYSTAL

CROSS-REFERENCE TO RELATED APPLICATION

This application is a continuation of copending International Application PCT/DE00/02170, filed Jul. 4, 2000, which designated the United States.

BACKGROUND OF THE INVENTION

1. Field of the Invention

The invention relates to a device for producing at least one SiC single crystal using a sublimation process that is performed in a crucible.

Published German Patent DE 32 30 727 C2 discloses a method and a device for the sublimation growth of an SIC single crystal. For this purpose, solid silicon carbide (SiC), which is situated in a storage area, is heated to a temperature of between 2000° C. and 2500° C. and is thereby sublimed. A SiC gas phase, which forms through the sublimation, contains components that include inter alia, pure silicon (Si) and the carbide compounds $Si_2C$, $SiC_2$, and SiC. The gas mixture of this SiC gas phase diffuses through a porous graphite wall into a reaction or crystal area in which an SiC seed crystal is situated. Silicon carbide crystallizes out of the SiC gas phase on this seed crystal at a crystallization temperature of between 1900° C. and 2000° C. In addition to the gas mixture of the SiC gas phase, in the crystal area, there is also a shielding gas that is preferably argon (Ar). A pressure of between 1 mbar and 5 mbar, which is desired in the crystal area, is set by suitably introducing this argon gas. The overall pressure in the crystal area is composed of the vapor partial pressure of the SiC gas phase and the vapor partial pressure of the argon gas.

Published International Patent Application WO 94/23096 A1 describes a method and a device for sublimation growth using the modified Lely method. In each case disclosed, there is a gas passage arranged between the SiC storage area and the crystal area. This gas passage enables the sublimed gas mixture of the SiC gas phase to be supplied to the SiC seed crystal in the crystal area in a controlled and targeted manner.

Moreover, an arrangement of a plurality of such gas passages inside a crucible allows a plurality of SiC single crystals to be simultaneously produced. The sides of the crucible walls that face the inner zone of the crucible may also be provided with a heat-resistant coating, which is preferably produced by pyrolysis. Published International Patent Application WO 94/32096 does not give any precise details about the composition and mode of action of this coating.

Silicon carbide is a compound of silicon and carbon that is sublimed or vaporized in an incongruent form. An incongruent compound is understood as meaning a compound of at least two components in which, at a predetermined temperature, one of the two components (silicon) has a higher vapor pressure than the other (carbon). Therefore, considerably more silicon atoms than carbon atoms sublime out of the stock of solid SiC. This leads to the presence of an excess of silicon in the gas mixture of the SiC gas phase and the presence of an excess of carbon in the remaining stock. It is also said that the stock is carburized. The gas mixture of the SiC gas phase, at the process temperature of over 2000° C., is highly aggressive because of the pure silicon component. The silicon atoms that are highly excessively present in the SiC gas phase have a very considerable tendency to react with other material that is present in the crucible, for example, the material of the crucible wall. Particularly if the crucible wall, as in the prior art, consists of graphite, some of the silicon in the SiC gas phase is lost through a reaction with the carbon of the crucible wall. A further loss of silicon atoms results from the diffusion of atoms out through pores in the crucible wall or through joints between mechanically separate crucible elements from which the crucible is assembled. This lost fraction of silicon atoms is then no longer available for growing the SiC single crystal. In the crystal area, the stoichiometric ratio between silicon and carbon consequently does not correspond to the value required for growing a high-quality crystal.

Published International Patent Application WO 97/27350 A1 and the article Inst. Phys. Conf. Serial No. 142: Chapter 1, Silicon Carbide and Related Materials 1995 Conference, Kyoto, 1996 IOP Publishing Ltd., pages 29 to 32 describe a crucible made from a solid tantalum material. Since tantalum is a very heat-resistant material that is chemically stable even at high temperatures, there is barely any reaction between the tantalum of the crucible wall and the silicon of the aggressive SiC gas phase even at the growth temperature of over 2000° C., so that this source of silicon loss is eliminated in the tantalum crucible disclosed. However, silicon atoms continue to be lost via the joints between the individual crucible elements. Moreover, the tantalum crucible disclosed is so small that it is only possible to grow an SiC single crystal up to 3 mm long. In addition, a solid tantalum crucible is very complex and therefore also expensive to produce.

Further devices for producing an SiC single crystal are disclosed by U.S. Pat. No. 5,895,526 and Published Japanese Patent Application JP 10291899 A. Moreover, published German Patent Application DE 36 44 746 A1 describes a general method for growing a crystal from the melt and a device that can be used for this method.

SUMMARY OF THE INVENTION

It is accordingly an object of the invention to provide a device for producing at least one SiC single crystal which overcomes the above-mentioned disadvantages of the prior art apparatus of this general type.

In particular, it is an object of the invention to provide a device for producing at least one SiC single crystal in which, compared to the prior art, the device loses fewer silicon atoms in the SiC gas phase, and the device is suitable for growing a longer SiC single crystal.

With the foregoing and other objects in view there is provided, in accordance with the invention, a device for producing at least one SiC single crystal. The device includes a crucible and a heater device configured outside of the crucible. The crucible has a crucible inner zone, at least one storage area for holding a stock of solid SiC, and at least one crystal area for holding at least one SiC seed crystal onto which an SiC single crystal grows. The crucible has a side that faces the crucible inner zone. The side that faces the crucible inner zone is lined with a foil that includes a material selected from the group consisting of tantalum, tungsten, niobium, molybdenum, rhenium, iridium, ruthenium, hafnium, and zirconium.

The invention is based on the discovery that, at the high process temperature involved in growing the SiC single crystal, the foil that is used to line the crucible is carburized.

Carburization of this type involves a change in volume of the foil. When using a foil, this change in the foil, in contrast to the situation when using a coating that is applied in fixed form to the outer crucible wall, results in a change in length and thickness. In particular the change in length of the foil may amount to up to 10%. By contrast, a coating that would be fixed to the inner wall of the crucible would grow primarily in the thickness direction during the carburization, because of the adhesion to the crucible wall. However, this very change in the length of the foil advantageously seals gaps or pores that are present in the crucible wall. Closing off these unsealed locations has the positive consequence that it is virtually impossible for any silicon of the SiC gas phase to diffuse out of the crucible inner zone. Since the material of the foil is also chemically stable with respect to the aggressive SiC gas phase and there is no significant reaction with the silicon component of the SiC gas phase, both main sources of loss of silicon atoms in the SiC gas phase are thereby eliminated. Consequently, there is no longer any significant loss of silicon atoms.

Rather, a small proportion of carbon atoms are removed from the SiC gas phase as part of the carburization of the foil. However, this only takes place at the beginning of the growth process and lasts until the foil has been completely carburized. The proportion of carbon that is withdrawn is so small that, when considered over the entire duration of the process, it can be regarded as negligible. The silicon to carbon ratio in the SiC gas phase is therefore barely affected, and corresponds to the level that is required for growing a high-quality crystal throughout the entire duration of the process.

Since there is no significant loss of silicon, a virtually continuous silicon cycle is formed in the SiC gas phase, in which the silicon atoms have the property of acting as a transport medium. This silicon cycle proceeds as follows: In the storage area, a gaseous Si atom reacts with an SiC particle that has been sublimed out of the solid SiC and then forms a gaseous $Si_2C$ compound, which is transported to the crystal area, for example by diffusion. In that area, during the crystalline deposition on a crystallization surface of the growing SiC single crystal, the compound is then once again separated into an Si atom and an SiC compound, which contributes to the crystal growth of the SiC single crystal. The free Si atom that remains then passes back to the stock of solid SiC, for example, by diffusion or convection mechanisms, and can then form another $Si_2C$ compound, with the result that the cycle is closed.

Since, apart from the initial incongruent sublimation until the standard Si excess is established in the SiC gas phase, in each case, the same quantities of silicon and carbon atoms are removed from the stock during the further sublimation growth; the carburization of the stock that is customary in the prior art is also no longer present. Consequently, the yield of the stock of solid SiC rises.

The foil that is used for the lining may already have been partially carburized to a certain extent even before the growth process has begun. If the residual carburization involves a sufficient change in length to completely seal the pores and joints in the wall of the crucible, however, such partial carburization of the foil is possible without causing any problems. The lining is not necessarily present throughout the entire inner zone of the crucible. It is also possible for the lining to be only present in the crystal area and in the area in which the transport of the material of the sublimed gas mixture to the SiC single crystal takes place. However, the crucible may also be fully lined.

Moreover, compared to a crucible made from solid tantalum material, the foil lining also offers further advantages. This is because unlike a solid tantalum crucible, a foil is easy and inexpensive to produce. The crucible is lined simply by laying the foil loosely against the inner walls of the crucible. There is no need for the foil to be specially attached to the crucible inner walls. Therefore, the crucible size is not limited, unlike the solid tantalum crucible. Rather, the size of the crucible is determined by the crucible that will be lined, and the crucible may be present in any desired three-dimensional geometry and size. Retrospective foil lining of this type is always possible. Therefore, it is also possible to grow a significantly larger SiC single crystal than was possible in the prior art. This is because the small overall size of the solid tantalum crucible limited the length of the SiC single crystal that could be grown to a correspondingly short value.

In accordance with an added feature of the invention, the foil is advantageously limited to be only up to 200 $\mu$m. A foil of this type is easy to produce and can also be introduced into the crucible inner zone as a lining without problems. In particular, a foil of this type is considerably less expensive than a crucible made from a solid material having the same properties as the material of the foil. The thickness of the foil used is typically 50 $\mu$m.

In accordance with an additional feature of the invention, the crucible is at least substantially made from graphite. Since the foil lining already prevents a chemical reaction between the crucible walls and the components of the SiC gas phase and also seals the crucible, no further demands need to be imposed on those areas of the crucible walls that are remote from the crucible inner zone. For these areas of the crucible, it is possible to use graphite, which can be produced relatively inexpensively and easily. Since graphite also has a higher resistivity than tantalum, an inductive heater device leads to a greater penetration depth in a graphite wall than in a tantalum wall. Consequently, a graphite wall is heated more homogeneously than a tantalum wall. Therefore, compared to a tantalum crucible, a crucible that is produced substantially from graphite is heated more homogeneously overall. As well as the foil lining, at least one further element made from a material other than graphite, for example from glassy carbon, may also be present in the crucible. A further element of this type may, for example, be a glassy carbon insert that is used to guide the gas.

In accordance with another feature of the invention, the heater device has an inductive design and is arranged outside of the crucible. It has been found that at the high process temperature of over 2000° C. that is required for sublimation growth, an inductive heater device is more suitable than a resistance heater, which is also possible in principle. When using resistance heating, degradation of the resistance heater element may occur at the high process temperature. Consequently, the resistance heater element has only a limited service life and has to be replaced at regular intervals. This entails undesirable additional outlay and costs that are not present with an inductive heater device, since there is no comparable wearing part.

In accordance with a further feature of the invention, the heater device may have a multi-part design. In particular, each area of the crucible may be assigned a separately controlled part of the heater device. In this way, it is then possible for the temperature in the crystal area to be controlled substantially independently of the temperature in the storage area.

In accordance with a concomitant feature of the invention, the crucible has a double-walled design. The double-walled design offers advantages when using an inductive heater device. This is because a double wall leads to homogenization of the temperature distribution that is established in the outer crucible wall because of the induced currents in the crucible inner zone between the storage area and the crystal area. The inductive heater device heats the crucible by the induction of a high electric current in the outer crucible wall. Local temperature distribution maxima occur in the region of the induced electric currents. Additional thermal coupling of the inner crucible wall to the outer crucible wall evens out these fluctuations in the temperature distribution. Therefore, the desired homogeneous profile of the temperature gradient is obtained in the crucible inner zone.

Other features which are considered as characteristic for the invention are set forth in the appended claims.

Although the invention is illustrated and described herein as embodied in device for the sublimation growth of an SiC single crystal with foil-lined crucible, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The sole drawing FIGURE shows a device for growing an SiC single crystal.

DESCRIPTION OF THE PREFERRED EMBODIMENTS

A preferred exemplary embodiment will now be explained in more detail with reference to the sole drawing figure. For the sake of clarity, the drawing is not to scale and certain features are only diagrammatically indicated.

Referring now to the sole drawing figure in detail, there is shown a device for growing an SiC single crystal in a foil-lined crucible. The device, which is illustrated in section, in the figure is used for the sublimation growth of an SiC single crystal 32, in the form of a volume single crystal, which grows on an SiC seed crystal 31. A crucible 10 with a crucible inner zone 11 is used for the sublimation growth. The crystal growth then takes place in a crystal area 13 of the crucible 10. The SiC seed crystal 31 is attached to a crucible cover 101 of the crucible 10. The crucible pot 102 has a storage area 12 in which a stock of solid SiC 30 is stored. This solid SiC is sublimed at a process temperature of over 2000° C. As a result, an SiC gas phase is formed which at least contains the components Si, $Si_2C$, $SiC_2$ and SiC. The components of the SiC gas phase are transported from the storage area 12 to the crystal area 13 by means of a gas flow 26, and in the crystal area 13 these components crystallize on a crystallization surface 33 of the growing SiC single crystal 32.

The solid SiC 30 in the storage area 12 may be a compact block of SiC material, in particular sintered SiC, or pulverulent, polycrystalline SiC.

The gas flow 26 may also be specifically directed onto the crystallization surface 33. A concentration profile of the components of the SiC gas phase that are supplied via the gas flow 26 is present on the crystallization surface 33. This concentration profile may be either homogeneous or of predetermined form. It is possible to provide the components of the SiC gas phase with a higher concentration in the edge region of the crystallization surface 33 than in the center of the crystallization surface 30. This compensates for the inhomogeneous temperature profile, which produces a lower temperature in the center of the crystallization surface 33 than in the edge region. Then, instead of the convex growth phase boundary which is otherwise customary, a practically planar growth phase boundary is obtained. This increases the yield and the quality of crystal.

The crucible 10 is heated to the process temperature by an inductive heater device 16. The crucible 10 has an inner crucible wall 14 and an outer crucible wall 15. This double-wall design enables a homogenous temperature gradient to be established in the crucible inner zone 11 between the storage area 12 and the crystal area 13.

The crucible 10 includes at least two mechanically independent crucible elements, namely the crucible pot 102 and the crucible cover 101. The crucible cover 101 is placed onto the crucible pot 102, closing off the latter. However, a joint 103, which in particular is permeable to the silicon atoms of the SiC gas phase, is produced at the contact surface between the crucible cover 101 and the crucible pot 102. Therefore, a foil lining 17 is located on the side of a crucible wall which faces the crucible inner zone 11. The foil lining 17 includes a tantalum foil that is approximately 50 $\mu$m thick. At the process temperature of over 2200° C., the tantalum foil is carburized even before or at the same time that the SiC seed crystal begins to grow and in the process its length is increased by up to 10%. This change in length then seals the crucible 10, so that it is virtually impossible for any silicon of the SiC gas phase to leave the crucible inner zone 11 through the joint 103 or through pores (not shown) in the crucible wall. The tantalum and also the tantalum carbide, which forms in the foil lining 17, are moreover, chemically stable with respect to the aggressive SiC gas phase at the process temperature during crystal growth, so that there is barely any relevant reaction with the silicon atoms of the SiC gas phase. Therefore, silicon atoms cannot be lost from the SiC gas phase either by diffusing out or as a result of a chemical reaction. This has a beneficial effect on high-quality crystal growth.

The crucible 10 illustrated in the figure is designed to grow just one SiC single crystal 32. However, there are also other embodiments for the crucible 10 which allow a plurality of SiC single crystals to be simultaneously grown.

In principle, it is possible for the SiC single crystal 32 that is grown to be of any polytype. The device can be used to produce all of the conventional SiC polytypes, such as for example 4H—SiC, 6H—SiC or 15R—SiC. Cubic SiC can also be grown from the 3C—SiC polytype.

We claim:

1. A device for producing at least one SiC single crystal, comprising:

a crucible and a heater device configured outside of said crucible;

said crucible having a crucible inner zone, at least one storage area for holding a stock of solid SIC, and at least one crystal area for holding at least one SiC seed crystal onto which an SiC single crystal grows;

said crucible having a side that faces said crucible inner zone;

said side being lined with a foil that includes a material selected from the group consisting of tantalum, tungsten, niobium, molybdenum, rhenium, iridium, ruthenium, hafnium, and zirconium.

2. The device according to claim 1, wherein said foil has a thickness of up to 200 μm.

3. The device according to claim 2, wherein said crucible is at least substantially made from graphite.

4. The device according to claim 1, wherein said crucible is at least substantially made from graphite.

5. The device according to claim 1, wherein said heater device is an inductive heater device.

6. The device according to claim 1, wherein said crucible has a double-walled design.

7. A device for producing at least one SiC single crystal, comprising:

a crucible and a heater device configured outside of said crucible;

said crucible having a crucible inner zone, at least one storage area for holding a stock of solid SiC, and at least one crystal area for holding at least one SiC seed crystal onto which an SiC single crystal grows;

said crucible having a side that faces said crucible inner zone;

said side being lined with a foil that includes a material selected from the group consisting of tantalum, tungsten, niobium, molybdenum, rhenium, iridium, ruthenium, hafnium, and zirconium, said foil provided for expanding under temperature for sealing off said crucible.

8. The device according to claim 7, wherein said foil expanding by up to 10% due to the temperature.

9. The device according to claim 7, wherein said foil is lined loosely against said side of said crucible for allowing said foil to expand under effects of temperature.

10. The device according to claim 7, wherein said foil is not attached to said side of said crucible for allowing said foil to expand under effects of temperature.

* * * * *